(12) United States Patent
Zhang

(10) Patent No.: US 11,296,298 B2
(45) Date of Patent: Apr. 5, 2022

(54) METHOD FOR MANUFACTURING FLEXIBLE ORGANIC LIGHT-EMITTING DIODE DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Yue Zhang, Wuhan (CN)

(*) Notice: Subject to any disclaimer, the term of this patent is extended or adjusted under 35 U.S.C. 154(b) by 49 days.

(21) Appl. No.: 16/630,445

(22) PCT Filed: Oct. 10, 2019

(86) PCT No.: PCT/CN2019/110391
§ 371 (c)(1),
(2) Date: Jan. 12, 2020

(87) PCT Pub. No.: WO2021/007962
PCT Pub. Date: Jan. 21, 2021

(65) Prior Publication Data
US 2021/0167316 A1   Jun. 3, 2021

(30) Foreign Application Priority Data
Jul. 18, 2019 (CN) .......................... 201910650860.2

(51) Int. Cl.
*H01L 51/52* (2006.01)
*H01L 27/32* (2006.01)
(Continued)

(52) U.S. Cl.
CPC ...... *H01L 51/5206* (2013.01); *H01L 27/3244* (2013.01); *H01L 51/003* (2013.01);
(Continued)

(58) Field of Classification Search
None
See application file for complete search history.

(56) References Cited

U.S. PATENT DOCUMENTS

2010/0025667 A1* 2/2010 Liu ...................... H01L 51/0533
257/40
2013/0258568 A1* 10/2013 Iwata ........................ H01B 1/22
361/679.01
(Continued)

FOREIGN PATENT DOCUMENTS

CN    103777417 A    5/2014
CN    105762305 A    7/2016
(Continued)

OTHER PUBLICATIONS

Martinez, Eduardo D, et al. "Silver Nanowires in Poly(Methyl Methacrylate) as a Conductive Nanocomposite for Microfabrication." Flexible and Printed Electronics, vol. 1, No. 3, 2016, p. 035003., doi:10.1088/2058-8585/1/3/035003. (Year: 2016).*
(Continued)

*Primary Examiner* — Joe E. Schoenholtz

(57) ABSTRACT

The present application provides a display panel, a manufacturing method and an intelligent wearable device of flexible organic light-emitting diode (OLED). The display panel includes a conductive layer and a metallic anode layer disposed at one side of the conductive layer, wherein a material of the conductive layer is a mixture of silver-nanowires and polymethyl methacrylate (PMMA).

11 Claims, 2 Drawing Sheets

(51) Int. Cl.
*H01L 51/00* (2006.01)
*H01L 51/56* (2006.01)

(52) U.S. Cl.
CPC ...... *H01L 51/0021* (2013.01); *H01L 51/0097* (2013.01); *H01L 51/56* (2013.01); *H01L 2227/326* (2013.01); *H01L 2251/5338* (2013.01); *H01L 2251/558* (2013.01)

(56) References Cited

U.S. PATENT DOCUMENTS

| | | | |
|---|---|---|---|
| 2013/0273315 A1* | 10/2013 | Mansky | G02F 1/13439 |
| | | | 428/138 |
| 2018/0047798 A1* | 2/2018 | Abe | H01L 27/3246 |
| 2018/0114905 A1* | 4/2018 | Yu | H01L 51/003 |
| 2019/0191569 A1 | 6/2019 | Jones et al. | |
| 2020/0220080 A1* | 7/2020 | Morii | H01L 51/50 |
| 2020/0321564 A1* | 10/2020 | Hamer | H01L 51/0097 |
| 2020/0388791 A1* | 12/2020 | Zhang | H01L 51/5275 |

FOREIGN PATENT DOCUMENTS

| | | |
|---|---|---|
| CN | 108963090 A | 12/2018 |
| CN | 109888122 A | 6/2019 |
| WO | 2018109724 A1 | 6/2018 |

OTHER PUBLICATIONS

Han, Tae-Hee, et al. "Flexible Transparent Electrodes for Organic Light-Emitting Diodes." Journal of Information Display, vol. 16, No. 2, 2015, pp. 71-84., doi:10.1080/15980316.2015.1016127. (Year: 2015).*

* cited by examiner forming a conductive layer, a material of which is a mixture of silver-nanowires and polymethyl methacrylate (PMMA) — S20 forming a metallic anode layer on the conductive layer — S30

METHOD FOR MANUFACTURING FLEXIBLE ORGANIC LIGHT-EMITTING DIODE DISPLAY PANEL

FIELD OF INVENTION

The present application relates to a field of display technology, and more particularly to a flexible organic light-emitting diode (OLED) display panel and a manufacturing method thereof, and an intelligent wearable device.

BACKGROUND OF INVENTION

As the development of mobile internet technology and the maturity of core hardware technologies for wearable devices, such as low-power consumption chips and flexible circuit boards, wearable devices with flexible display function have gradually moved from conceptualization to commercialization.

Currently, industrial production of flexible OLED display panels mostly use hard-screen glass substrates. A commonly used anode structure is provided with an anode ITO/Ag/ITO structure. That is, a main electrode material is ITO (indium tin oxide), which is widely used for electrodes of photovoltaics devices because of its high transmittance and high electrical conductivity.

The technical problem is when an ITO electrode is applied to the flexible OLED display panel, sheet resistance of ITO electrode will rapidly rise after multiple bendings of the flexible OLED display. Therefore, ITO electrode is not suitable for manufacturing of the flexible OLED, in particularly to intelligent wearable devices with the flexible OLED display panel, ITO electrode is even more incapable for adapting different curved shapes when the intelligent wearable device is worn on different parts of a human body. Moreover, as raw material resources for ITOs become increasingly scarce, the cost becomes higher and higher. Additionally, ITO also has its own disadvantages such as non-acid resistance and brittleness. Therefore, a self-supporting and flexible OLED display panel is urgently needed.

SUMMARY OF INVENTION

In order to resolve the problems, the present application provides technical solutions as follows:

An embodiment of the present application in an aspect provides a flexible organic light emitting diode (OLED) display panel, comprising a conductive layer and a metallic anode layer disposed at one side of the conductive layer, wherein a material of the conductive layer is a mixture of silver-nanowires and polymethyl methacrylate (PMMA).

In the flexible OLED display panel provided by the embodiment of the present application, further comprising a flexible supporting layer disposed at one side of the conductive layer away from the metallic anode layer, wherein a material of the flexible supporting layer is PMMA.

In the flexible OLED display panel provided by the embodiment of the present application, wherein a thickness of the flexible supporting layer is from 1 um to 10 um.

In the flexible OLED display panel provided by the embodiment of the present application, wherein a thickness of the conductive layer is from 50 nm to 150 nm.

In the flexible OLED display panel provided by the embodiment of the present application, wherein an orthographic projection of the conductive layer on the metallic anode layer coincides with the metallic anode layer.

In the flexible OLED display panel provided by the embodiment of the present application, wherein a flexible OLED module is disposed on the metallic anode layer.

According to the above object of the present invention, further providing a method for manufacturing a flexible organic light emitting diode (OLED) display panel, comprising:

forming a conductive layer, a material of which is a mixture of silver-nanowires and polymethyl methacrylate (PMMA); and forming a metallic anode layer on the conductive layer.

In the method for manufacturing the OLED display panel provided by the embodiment of the present application, before forming the conductive layer, the method further comprises:

forming a flexible supporting layer, wherein the conductive layer is formed on the flexible supporting layer, and a material of the flexible supporting layer is PMMA.

In the method for manufacturing the OLED display panel provided by the embodiment of the present application, forming the flexible supporting layer comprises:

providing a substrate;

forming a hydrophobic layer on a surface of the substrate; and forming the flexible supporting layer on the hydrophobic layer, wherein after forming the metallic anode layer on the conductive layer, the method further comprises:

peeling off the hydrophobic layer from the flexible supporting layer.

In the method for manufacturing the OLED display panel provided by the embodiment of the present application, forming the flexible supporting layer, the material of which is PMMA, comprises:

spin-coating a mixed-dispersion solution of silver-nanowires and PMMA on the flexible supporting layer utilizing a first spin-coating process, then subjecting the spin-coated mixed-dispersion solution of silver-nanowires and PMMA to a first baking process to cure the spin-coated mixed-dispersion solution to form the conductive layer, of which the material is the mixture of silver-nanowires and PMMA.

In the method for manufacturing the OLED display panel provided by the embodiment of the present application, in the first spin-coating process, a speed for spin-coating the mixed-dispersion solution of silver-nanowires and PMMA is from 1000 rpm to 3000 rpm, and a duration for spin-coating the mixed-dispersion solution of silver-nanowires and PMMA is from 10 seconds to 60 seconds.

In the method for manufacturing the OLED display panel provided by the embodiment of the present application, a temperature of the first baking process is 100° C., and a baking duration is 3 minutes.

In the method for manufacturing the OLED display panel provided by the embodiment of the present application, a thickness of the conductive layer is from 50 nm to 150 nm.

In the method for manufacturing the OLED display panel provided by the embodiment of the present application, the method of forming the flexible supporting layer, of which the material of the flexible material is PMMA, comprises:

spin-coating a PMMA solution on the hydrophobic layer by utilizing a second spin-coating process, then subjecting the spin-coated PMMA solution to a second baking process to cure the spin-coated PMMA solution to form the flexible supporting layer, of which the material is PMMA.

In the method for manufacturing the OLED display panel provided by the embodiment of the present application, in the second spin-coating process, a speed for spin-coating the PMMA solution is from 600 rpm to 3000 rpm, and a duration for spin-coating the PMMA solution is from 10 seconds to 120 seconds.

In the method for manufacturing the OLED display panel provided by the embodiment of the present application, a temperature of the second baking process is 100° C., and a baking duration is 3 minutes.

In the method for manufacturing the OLED display panel provided by the embodiment of the present application, a concentration of the PMMA solution is from 1 mg/ml to 10 mg/ml.

In the method for manufacturing the OLED display panel provided by the embodiment of the present application, the substrate is a rigid silicon substrate or a rigid glass substrate.

In the method for manufacturing the OLED display panel provided by the embodiment of the present application, forming the hydrophobic layer on the surface of the substrate comprises:

cleaning the substrate; and leaving the cleaned substrate in n-octadecyltrichlorosilane vapor at 95° C. for 4 hours to form the hydrophobic layer on the surface of the substrate.

According to the above object of the present application, further comprising an intelligent wearable device which comprises any one of the flexible OLED display panel as described above.

The beneficial effect is that the roughness of the surface of the conductive layer is reduced by using the mixture of silver-nanowires and PMMA as the material of the conductive layer, so that the conductive layer has good continuity, thereby improving the electrical conductivity of the metallic anode layer located on the conductive layer. Moreover, flexible supporting of other parts of the flexible OLED display panel is well realized by the flexible supporting layer with using PMMA as the material of the flexible supporting layer. Additionally, in the manufacturing process, by forming the hydrophobic layer on the surface of the substrate, the fabricated flexible supporting layer is well-separated from the substrate by the hydrophobic layer. Overall, good overall flexible supporting of the flexible OLED display panel is realized by the flexible supporting layer, and the conductive layer also has well flexible bending ability, so that the flexible OLED display panel can be well adapted for intelligent wearable devices.

DESCRIPTION OF DRAWINGS

In order to clearly illustrate embodiments or technical solution in the prior art, a brief description of drawings used in the embodiments or the description of the prior art would be given as below. Obviously, the drawings in the following description are merely some embodiments of the application. For persons skilled in this art, other drawings can be obtained from these drawings under the premise of the creative labor without paying.

DETAILED DESCRIPTION OF PREFERRED EMBODIMENTS

Specific structural and functional details disclosed herein are merely representative, and are used to describe objects of exemplary embodiments. However, the present application may be concretely implemented with multiple alternative forms, and it should not be explained as being limited only to the embodiments described herein.

In the description of the present application, it should be understood that directional terms or spatially relative terms such as "central", "upper", "lower", "left", "right", "vertical", "horizontal", "top", "bottom", "inner", "outer" are orientations or directions with referring to the accompanying drawings, and are merely for describing the present application and illustrating briefly, which does not indicate or imply that the referred equipment or device must have a specific orientation to construct and operate with a specific orientation. Therefore, it cannot be understood as a limitation to the application. Additionally, terms such as "first", "second" are only used for illustrating objects, and are not to be understood as indicating or implying relative importance or as implicitly including one or more the features. In the description of the present application, unless otherwise stated, "multiple" means two or more. Besides, the term "include" and its variations are intended to cover non-exclusive inclusions.

In the description of the present application, it should be explained that unless otherwise explicitly stated and limited, terms "to install", "to connect", "connection" should be understood broadly. For example, it may be a fix connection, a detachable connection, or an integral connection; it may be a mechanical connection, an electrical connection; it may be directly connected, or may be indirectly connected through an intermediate medium, and may be an internal connection of two components. The specific meanings of the above terms in the present application can be specifically understood for persons skilled in this art.

The terms used herein are merely for describing embodiments and are not intended to limit exemplary embodiments. Unless the context indicates expressly otherwise, the singular forms "a" and "one" used here are intended to include the plural. It should be further understood that the terms "include" and/or "comprise" used here specifies the existence of the stated features, integers, steps, operations, units and/or components, without excluding the existence or addition of one or more other features, integers, steps, operations, units, components and/or combinations thereof.

The application is further described below in conjunction with the accompanying drawings and embodiments.

Figures 1, 2:
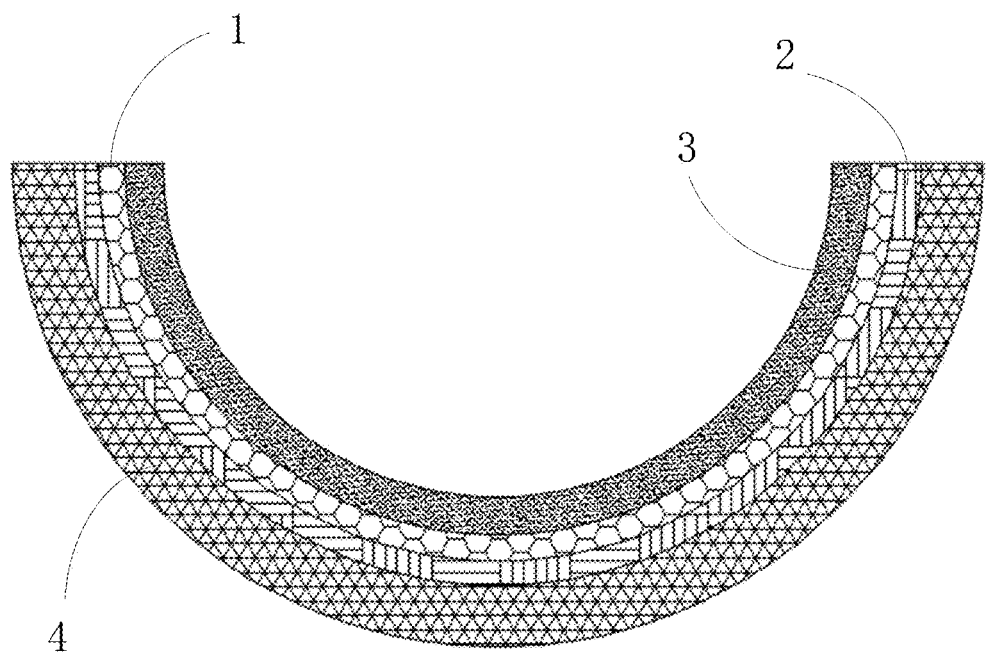
FIG. 1 is a schematic structural diagram showing a flexible organic light emitting diode (OLED) display panel in accordance with the embodiment of the present application.
FIG. 2 is a schematic flowchart of a method for manufacturing the flexible OLED display panel in accordance with the embodiment of the present application.

FIG. 1 is a flexible organic light emitting diode (OLED) display panel in accordance with the embodiment of the present application, including a conductive layer 1 and a metallic anode layer 2 disposed at one side of the conductive layer, wherein a material of the conductive layer is a mixture of silver-nanowires and polymethyl methacrylate (PMMA). Specifically, the metallic anode layer 2 is made of silver material. In the mixture of silver-nanowires and PMMA, PMMA is polymethyl methacrylate, diameters of silver-nanowires are from 10 um to 200 um, and a thickness of the conductive layer 1 is from 50 nm to 150 nm.

In an embodiment, an orthographic projection of the conductive layer 1 on the metallic anode layer 2 coincides with the metallic anode layer. It should be understood that a pattern of the orthographic projection of the conductive layer 1 on the metallic anode layer 2 is same as an anode pattern of the metallic anode layer 2. Moreover, the material of the conductive layer 1 is the mixture of silver-nanowires and PMMA, compared with the original ITO electrode, the conductive layer 1 made of the mixture of silver-nanowires and PMMA has a lower surface roughness and is more smooth and uniform. It improves a continuity of the metallic anode layer 2 (especially to a silver anode layer) to make the metallic anode layer 2 get better electrical conductivity.

In an embodiment, the flexible OLED display panel further includes a flexible supporting layer 3 which is disposed at one side of the conductive layer 1 away from the metallic layer 2, wherein a material of the supporting layer 3 is PMMA. In an embodiment, specifically, a thickness of the flexible supporting layer 3 is from 1 um to 10 um.

It should be understood that in the flexible OLED display panel of the present application, the flexible supporting layer 3 and the metallic anode layer 2 are respectively located at two sides of the conductive layer 1, wherein the material of PMMA is colorless and transparent, with a transmittance from 90% to 92% and good toughness. Flexible supporting of other parts of the flexible OLED display panel is well realized by the flexible supporting layer with using PMMA as the material of the flexible supporting layer.

Corresponding to the above, in the flexible OLED display panel of the present application, a flexible OLED module 4 is disposed on the metallic anode layer 2. It should be understood that the structure of the flexible OLED module 4 is a common structure form known to persons skilled in this art. In an embodiment, the following structure is taken as an example, but not limited thereto, the flexible OLED module 4 disposed on the metallic anode layer 2 sequentially includes a hole injection layer, a hole transport layer, an organic light emitting layer, an electron transport layer, an electron injection layer, a metallic cathode layer, an encapsulation layer, and the like.

Above all, the present application reduces the roughness of the surface of the conductive layer by using the mixture of silver-nanowires and PMMA as the material of the conductive layer, so that the conductive layer has good continuity, thereby improving the electrical conductivity of the metallic anode layer located on the conductive layer, and flexible supporting of other parts of the flexible OLED display panel is well realized by the flexible supporting layer with using PMMA as the material of the flexible supporting layer.

Schematically, as shown in FIG. 1, the flexible OLED display panel of the present application does not need a support of a rigid backplate under a bending state, and it can realize flexible self-supporting through the flexible supporting layer under the bending state. Furthermore, compared with current ITO electrodes, the conductive layer of the present application is able to be well adhered to the flexible supporting layer under different bending states of the flexible supporting layer, it has good bending performance.

As shown in FIG. 2, the present application further provides a method for manufacturing a flexible organic light emitting diode (OLED), including:

In step S20: forming a conductive layer, a material of which is a mixture of silver-nanowires and polymethyl methacrylate (PMMA).

In step S30: forming a metallic anode layer on the conductive layer.

In an embodiment, in step S20, the conductive layer may be formed by by spin-coating a mixed-dispersion solution of silver-nanowires and PMMA on a base layer, then subjecting the spin-coated mixed-dispersion solution of silver-nanowires and PMMA to a baking process to cure the spin-coated mixed-dispersion solution to form the conductive layer, of which the material is the mixture of silver-nanowires and PMMA. Specifically, a speed for spin-coating the mixed-dispersion solution of silver-nanowires and PMMA is from 1000 rpm to 3000 rpm, and a duration for spin-coating is from 10 seconds to 60 seconds, and then the spin-coated mixed-dispersion solution is baked to cure the spin-coated mixed-dispersion solution under the condition of a temperature at 100° C. for 3 minutes. A specific thickness of the conductive layer can be adjusted by adjusting relevant parameters in an actual process. The preferred thickness of this embodiment is from 50 nm to 150 nm.

Corresponding to the above, in an embodiment, the used mixed-dispersion solution of silver-nanowires and PMMA can be prepared by the following approaches: taking 10 mg silver-nanowires in 10 ml PMMA solution and stirring by an ultrasonic magnetic stirrer to obtain the mixed-dispersion solution of silver-nanowires and PMMA, wherein a specific concentration of the PMMA solution is from 1 mg/ml to 10 mg/ml. The used material of silver-nanowires may be obtained by a process or other commercial approaches, and the process is a common technique well known to persons skilled in this art, no more tautology here.

It is worth noting that in step S20, after forming the conductive layer, the method further includes: patterning the conductive layer. Specifically, the conductive layer can be patterned by physical cutting or $O_2$ plasma ion etching to make the conductive layer to form a certain anode pattern.

In an embodiment, in step S30, the metallic anode layer is formed on the conductive layer. Specifically, the metallic layer with the anode pattern which is same as the conductive layer may be formed on the conductive layer by vacuum evaporation. Obviously, for persons skilled in this art, the desired anode pattern is formed by patterning the anode layer in the existing flexible OLED display panel, which is a common functional structure, no more tautology here.

Figure 3:
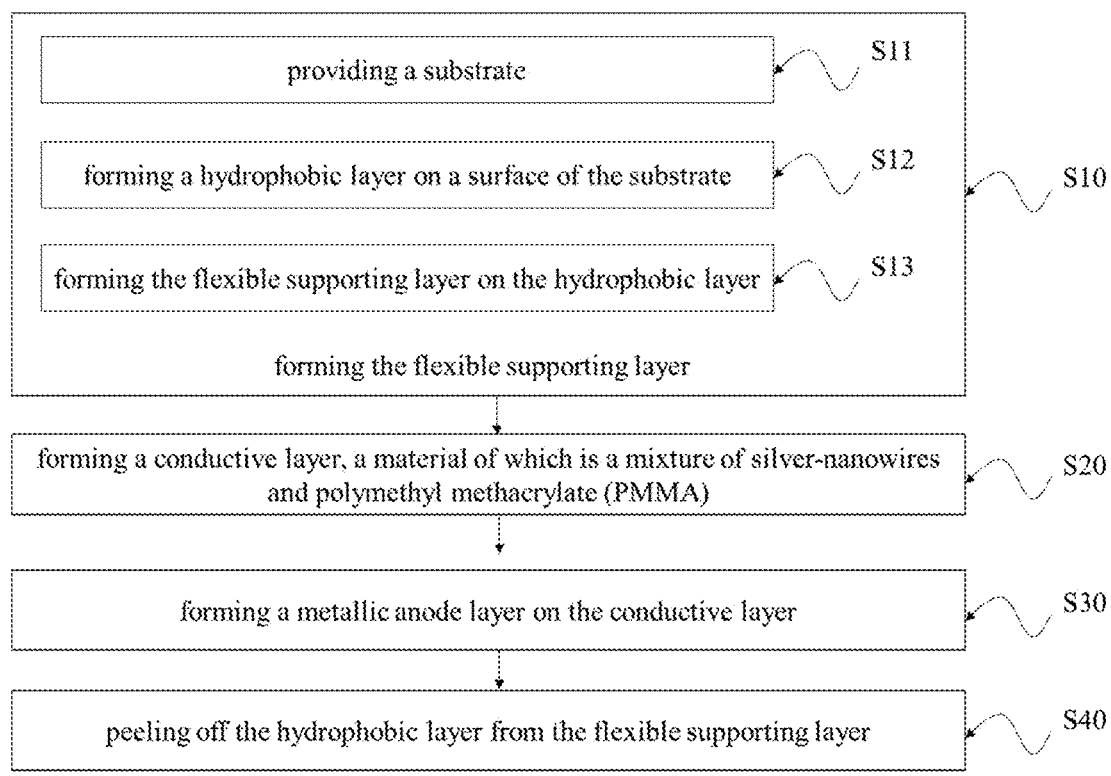
FIG. 3 is a schematic flowchart of another method for manufacturing the flexible OLED display panel in accordance with the embodiment of the present application.

In an embodiment, as shown in FIG. 3, before forming the conductive layer, the method further includes:

In step S10: forming a flexible supporting layer, wherein the conductive layer is formed on the flexible supporting layer, and a material of the flexible supporting layer is PMMA. Obviously, in an embodiment, the base layer in step S20 described previously may be the flexible supporting layer. That is, the conductive layer is formed by spin-coating the mixed-dispersion solution of silver-nanowires and PMMA on the flexible supporting layer, then subjecting the spin-coated mixed-dispersion solution of silver-nanowires and PMMA to the baking process to cure the spin-coated mixed-dispersion solution to form the conductive layer, of which the material is the mixture of silver-nanowires and PMMA.

Specifically, in step S10, forming the flexible supporting layer includes:

In step S11: providing a substrate;

In step S12: forming a hydrophobic layer on a surface of the substrate;

In step S13: forming the flexible supporting layer on the hydrophobic layer.

In an embodiment, in step S11, the provided substrate may be a rigid silicon substrate or a rigid glass substrate.

In an embodiment, in step S12, the hydrophobic layer is formed on the surface of the substrate. Specifically, the hydrophobic layer is formed on the surface of the substrate by leaving the substrate in n-octadecyltrichlorosilane vapor at 95° C. for 4 hours. In step S12, before forming the hydrophobic layer on the surface of the substrate, the method further includes a cleaning process to the substrate. Specifically, the cleaned substrate can be obtained by being respectively ultrasonically-cleaned with isopropanol (IPA), deionized water, and ethyl alcohol absolute, respectively, for 20 minutes, then blowing dry with nitrogen, and followed by drying in an inert atmosphere at 180° C. for 1 hour.

In an embodiment, in step S13: forming the flexible supporting layer on the hydrophobic layer, the flexible supporting layer of which the material is PMMA may be formed by spin-coating a PMMA solution on the hydrophobic layer, and subjecting the spin-coated PMMA solution to a baking process to cure the spin-coated PMMA solution. Specifically, under a condition that a speed for spin-coating the PMMA solution is from 600 rpm to 3000 rpm, the hydrophobic layer is spin-coated with the PMMA solution of which a concentration is from 1 mg/ml to 10 mg/ml for 10 seconds to 120 seconds, and then the PMMA solution is baked to cure the PMMA solution under a condition of a temperature at 100° C. for 3 minutes. A specific thickness of the flexible supporting layer formed may be adjusted by adjusting relevant parameters in an actual process. The preferred thickness of the flexible supporting layer is from 1 um to 10 um.

The after forming the metallic anode layer on the conductive layer, the method further includes:

In step S40: peeling off the hydrophobic layer from the flexible supporting layer. It should be understood that in a process for manufacturing the flexible OLED display panel, a flexible OLED module may be formed on the metallic anode layer. In an embodiment, as described previously, the flexible OLED module sequentially includes functional layers such as a hole injection layer, a hole transport layer, an organic light-emitting layer, an electron transport layer, an electron injection layer, a metallic cathode layer, and an encapsulation layer, each of functional layers can be formed by vacuum evaporation. The specific steps would no more describe in detail here.

In an embodiment, in step S40, the hydrophobic layer is peeled off from the flexible supporting layer. Specifically, the hydrophobic layer can be peeled off from the flexible supporting layer after forming the flexible OLED module on the metallic anode layer. It is worth noting that the hydrophobic layer can also be peeled off from the flexible supporting layer before forming the flexible OLED module on the metallic anode layer. To obtain a structure formed by the flexible supporting layer, the conductive layer and the metallic anode layer, the hydrophobic layer is peeled off from the flexible supporting layer, then the structure will be subsequently utilized.

Above all, the method for manufacturing the flexible OLED display panel of the present application, in the manufacturing process, by forming the hydrophobic layer on the surface of the substrate, the flexible supporting layer is separated well from the substrate by the hydrophobic layer. Moreover, the flexible supporting layer and the conductive layer are formed by the spin-coating and the baking process, and the thickness of the flexible supporting layer and the conductive layer are well controlled by adjusting the spin-coating parameters such as the solution concentration and the duration.

The present application further provides an intelligent wearable device, which includes anyone of the described flexible OLED display panel. The intelligent wearable device has good adaptability to various wearing parts of the human body, in particular, the flexible OLED display panel can be well bent to fit a surface of the wearing part according to each wearing part, and also has a certain self-supporting ability. For example, when the intelligent wearing device is worn on the wrist, the flexible OLED display panel of the intelligent wearing device can be curved around the wrist and displayed.

Above all, the present application reduces the roughness of the surface of the conductive layer by using the mixture of silver-nanowires and PMMA as the material of the conductive layer, so that the conductive layer has good continuity, thereby improving the electrical conductivity of the metallic anode layer located on the conductive layer, and flexible supporting of other parts of the flexible OLED display panel is well realized by the flexible supporting layer with using PMMA as the material of the flexible supporting layer. Additionally, in the manufacturing process, by forming the hydrophobic layer on the surface of the substrate, the fabricated flexible supporting layer is separated well from the substrate by the hydrophobic layer. Overall, good overall flexible supporting of the flexible OLED display panel is realized by the supporting layer, and the conductive layer also has good flexible bending ability, so that the flexible OLED display panel can be well adapted for intelligent wearable devices.

Above all, although the present application has been disclosed above in the preferred embodiments, the above preferred embodiments are not intended to limit the present application. For persons skilled in this art, various modifications and alterations can be made without departing from the spirit and scope of the present application. The protective scope of the present application is subject to the scope as defined in the claims.

What is claimed is:

1. A method for manufacturing a flexible organic light emitting diode (OLED) display panel, comprising:
   providing a substrate;
   forming a hydrophobic layer on a surface of the substrate;
   forming the flexible supporting layer on the hydrophobic layer;
   directly spin-coating a mixed-dispersion solution of silver-nanowires and polymethyl methacrylate (PMMA) on a surface of the flexible supporting layer by a first spin-coating process;
   curing the spin-coated mixed-dispersion solution through a first baking process to form a conductive layer, wherein a material of the conductive layer is a mixture of silver-nanowires and PMMA;
   directly forming a metallic anode layer on a surface of the conductive layer away from the flexible supporting layer; and
   peeling off the hydrophobic layer from the flexible supporting layer.

2. The method as claimed in claim 1, wherein a material of the flexible supporting layer is PMMA.

3. The method as claimed in claim 1, wherein in the first spin-coating process, a speed for spin-coating the mixed-dispersion solution of silver-nanowires and PMMA is 1000 rpm to 3000 rpm, and a duration for spin-coating the mixed-dispersion solution of silver-nanowires and PMMA is 10 seconds to 60 seconds.

4. The method as claimed in claim 1, wherein a temperature of the first baking process is 100° C., and a baking duration is 3 minutes.

5. The method as claimed in claim 1, wherein a thickness of the conductive layer is 50 nm to 150 nm.

6. The method as claimed in claim 1, wherein the forming the flexible supporting layer on the hydrophobic layer comprises:
   spin-coating a PMMA solution on the hydrophobic layer by a second spin-coating process, then subjecting the spin-coated PMMA solution to a second baking process to cure the spin-coated PMMA solution to form the flexible supporting layer, of which the material is PMMA.

7. The method as claimed in claim 6, wherein in the second spin-coating process, a speed for spin-coating the PMMA solution is 600 rpm to 3000 rpm, and a duration for spin-coating the PMMA solution is 10 seconds to 120 seconds.

8. The method as claimed in claim 6, wherein a temperature of the second baking process is 100° C., and a baking duration is 3 minutes.

9. The method as claimed in claim 6, wherein a concentration of the PMMA solution is 1 mg/ml to 10 mg/ml.

10. The method as claimed in claim 1, wherein the substrate is a rigid silicon substrate or a rigid glass substrate.

11. The method as claimed in claim 1, wherein forming the hydrophobic layer on the surface of the substrate comprises:

cleaning the substrate; and
   leaving the cleaned substrate in n-octadecyltrichlorosilane vapor at 95° C. for 4 hours to form the hydrophobic layer on the surface of the substrate.

\* \* \* \* \*